(12) United States Patent
Mandier et al.

(10) Patent No.: US 9,288,414 B2
(45) Date of Patent: Mar. 15, 2016

(54) MULTIPLE CONVERSION GAIN IMAGE SENSOR

(71) Applicant: STMicroelectronics (Grenoble 2) SAS, Grenoble (FR)

(72) Inventors: Christophe Mandier, Grenoble (FR); Alexis Marcellin, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 202 days.

(21) Appl. No.: 14/260,664

(22) Filed: Apr. 24, 2014

(65) Prior Publication Data

US 2014/0319322 A1 Oct. 30, 2014

(30) Foreign Application Priority Data

Apr. 26, 2013 (FR) .................................... 13 53841

(51) Int. Cl.
*H04N 5/378* (2011.01)
*H01L 27/146* (2006.01)

(52) U.S. Cl.
CPC .......... *H04N 5/378* (2013.01); *H01L 27/14609* (2013.01); *H01L 27/14612* (2013.01); *H01L 27/14641* (2013.01)

(58) Field of Classification Search
CPC ............. H04N 5/378; H01L 27/14609; H01L 27/14612; H01L 27/14641
USPC ....................................................... 250/208.1
See application file for complete search history.

(56) References Cited

U.S. PATENT DOCUMENTS

| 4,737,854 | A | * | 4/1988 | Tandon | ................ | H04N 3/1581 348/E3.027 |
|---|---|---|---|---|---|---|
| 6,040,568 | A | * | 3/2000 | Caulfield | ................. | H04N 5/33 250/208.1 |
| 7,569,868 | B2 | * | 8/2009 | Watanabe | .............. | H04N 3/155 257/184 |
| 2008/0210993 | A1 | | 9/2008 | Oshikubo et al. | | |
| 2011/0007196 | A1 | | 1/2011 | Yamashita et al. | | |
| 2013/0021441 | A1 | | 1/2013 | Kim | | |
| 2013/0155303 | A1 | | 6/2013 | Barbier | | |

* cited by examiner

*Primary Examiner* — Seung C Sohn
(74) *Attorney, Agent, or Firm* — Seed IP Law Group PLLC

(57) ABSTRACT

An image sensor including an array of pixels, each having: a storage node coupled to a capacitive sense node by a transfer transistor; and a connection transistor coupling the pixel sense node to an intermediate node of the pixel, wherein each pixel has its intermediate node coupled to a node of application of a reset voltage by a reset transistor, and different pixels have their respective intermediate nodes interconnected by a conductive connection track.

19 Claims, 4 Drawing Sheets

MULTIPLE CONVERSION GAIN IMAGE SENSOR

BACKGROUND

1. Technical Field

The present disclosure relates to image sensors, and more specifically to a multiple conversion gain complementary metal oxide semiconductor (CMOS) sensor.

2. Discussion of the Related Art

Conventionally, a CMOS image sensor comprises pixels arranged in an array of rows and columns. Each pixel comprises a photodiode used in reverse mode, having its junction capacitance discharged by a photocurrent according to a received light intensity. At the end of a period, called image acquisition or integration period, before and after which the pixel is reset by recharging of its photodiode, the photogenerated charges stored in the photodiode are transferred to a capacitive sense node of the pixel. The measurement of the illumination level received by the pixel is performed by measuring the sense node voltage.

The sense node capacitance conditions the pixel sensitivity to illumination level variations. The lower the sense node capacitance, the higher the charge-to-voltage conversion factor or gain of the pixel, in volts per electron, and conversely. Thus, a sense node of low capacitance enables to relatively easily discriminate low illumination variations, especially in low illumination conditions, but may however be unable to receive all the charges photogenerated in the photodiode in case of a strong illumination. Conversely, a sense node of high capacitance enables to measure high illumination levels, but does not enable to easily discriminate low illumination level variations, especially in low illumination conditions.

Image sensors where the capacitance of the sense node of a pixel can be adjusted during the sensor operation have already been provided, which enables to adapt the charge-to-voltage conversion gain of the pixel, and thus its sensitivity and the extent of its dynamic range, according to the luminosity conditions.

It is however desired to improve certain aspects of existing sensors having an adjustable reading capacity.

BRIEF SUMMARY

Thus, an embodiment provides an image sensor comprising an array of pixels, each having: a storage node coupled to a capacitive sense node by a transfer transistor; and a connection transistor coupling the sense node of the pixel to an intermediate node of the pixel, wherein each pixel has its intermediate node coupled to a node of application of a reset voltage by a reset transistor, and different pixels have their respective intermediate nodes interconnected by a conductive connection track.

According to an embodiment, each pixel further comprises a transistor connected as a source follower having its gate connected to the sense node of the pixel.

According to an embodiment, each pixel further comprises an output transistor coupling a source of the source follower transistor to an output line.

According to an embodiment, the pixels of the array are distributed in groups of pixels, the pixels of a same group having their respective intermediate nodes interconnected by a same connection track, the connection tracks of different groups being unconnected to one another.

According to an embodiment, each group of pixels comprises two or three pixels.

According to an embodiment, the pixels of a same group are located on a same column of the array.

According to an embodiment, the pixels of a same group are juxtaposed two by two in the array.

According to an embodiment, connection tracks of different groups are coupled two by two by a transistor.

According to an embodiment, each pixel comprises a photodiode having its cathode connected to the pixel storage node.

Another embodiment provides a method for capturing an image by means of a sensor of the above-mentioned type, comprising a cycle where a current pixel of the sensor is read, this cycle comprising a step of connecting the capacitive sense node of the current pixel to at least one capacitive sense node of another pixel of the sensor.

The foregoing and other features and advantages of the present disclosure will be discussed in detail in the following non-limiting description of specific embodiments in connection with the accompanying drawings.

DETAILED DESCRIPTION

Figure 1:
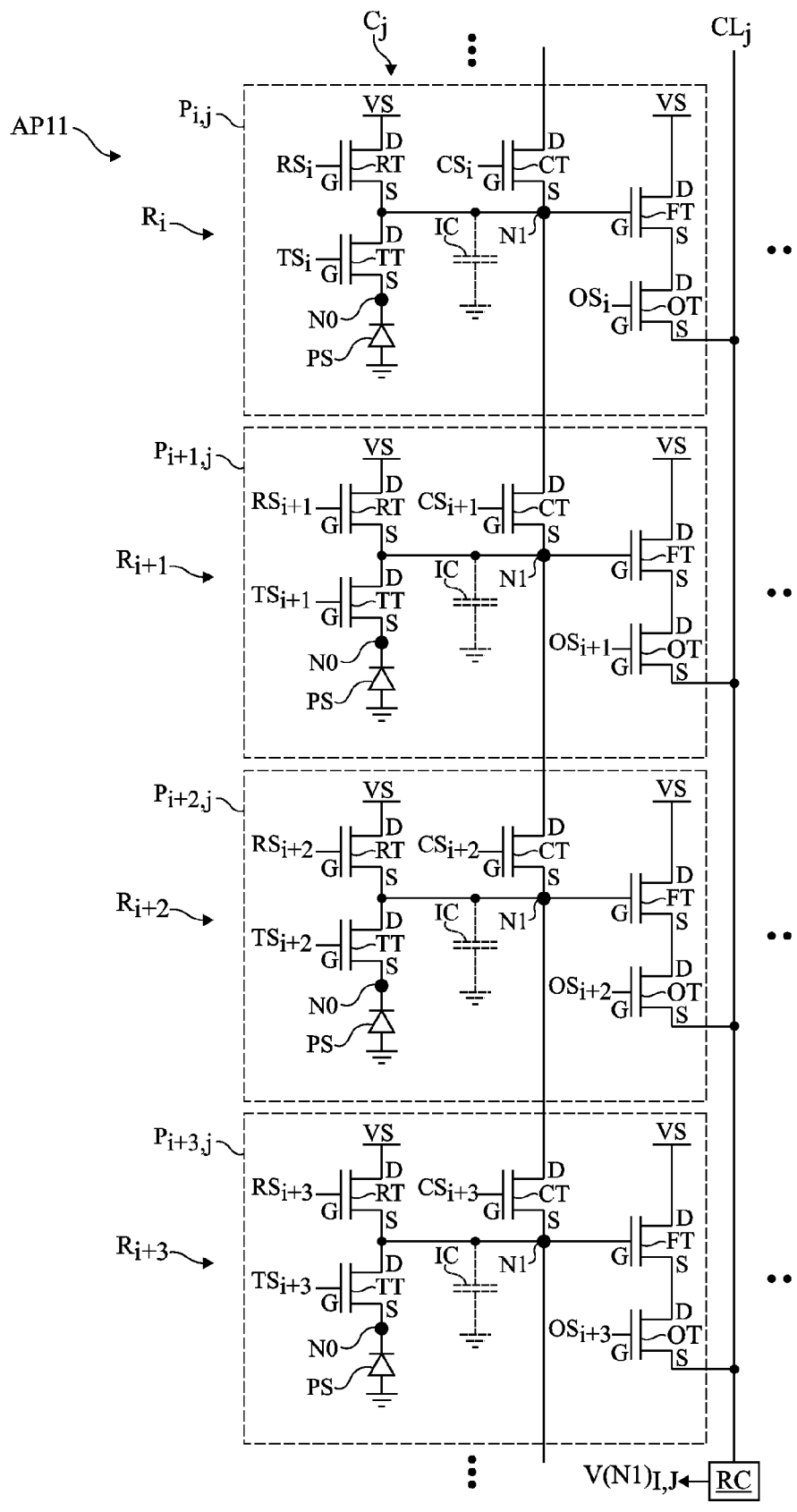
FIG. 1 is an electric diagram of a portion of an example of image sensor.

For clarity, the same elements have been designated with the same reference numerals in the different drawings. Further, only those elements which are useful to the understanding of the embodiments described hereafter have been detailed. In particular, the various peripheral elements that an image sensor may comprise, in addition to a pixel array (row and column decoder, read circuit, control circuit, signal processing unit, etc.) have not been detailed, the described embodiments being compatible with the usual peripheral elements of an image sensor, provided to perform, possibly, a few minor adaptations which are within the abilities of those skilled in the art.

U.S. patent application Ser. No. 13/711,037 is incorporated herein by reference in its entirety.

These previous patent applications describe an image sensor wherein, to increase the capacitance of the sense node of a pixel in case of a strong luminosity, it is provided, during the period of conversion of the charges stored in the pixel photodiode into voltage, to connect the pixel sense node to at least another sense node of another pixel of the sensor, which is not being used during this period. Indeed, conventionally, during the acquisition of an image by means of a CMOS pixel array, the pixels are not all read at the same time, so that, during the conversion into voltage of the charges stored in the photodiode of a pixel of the sensor, or current pixel, the sense nodes of certain other sensor pixels are not being used, and can thus be connected to the current pixel sense node to increase the capacitance thereof (and thus decrease its charge-to-voltage conversion factor).

Figure 4:
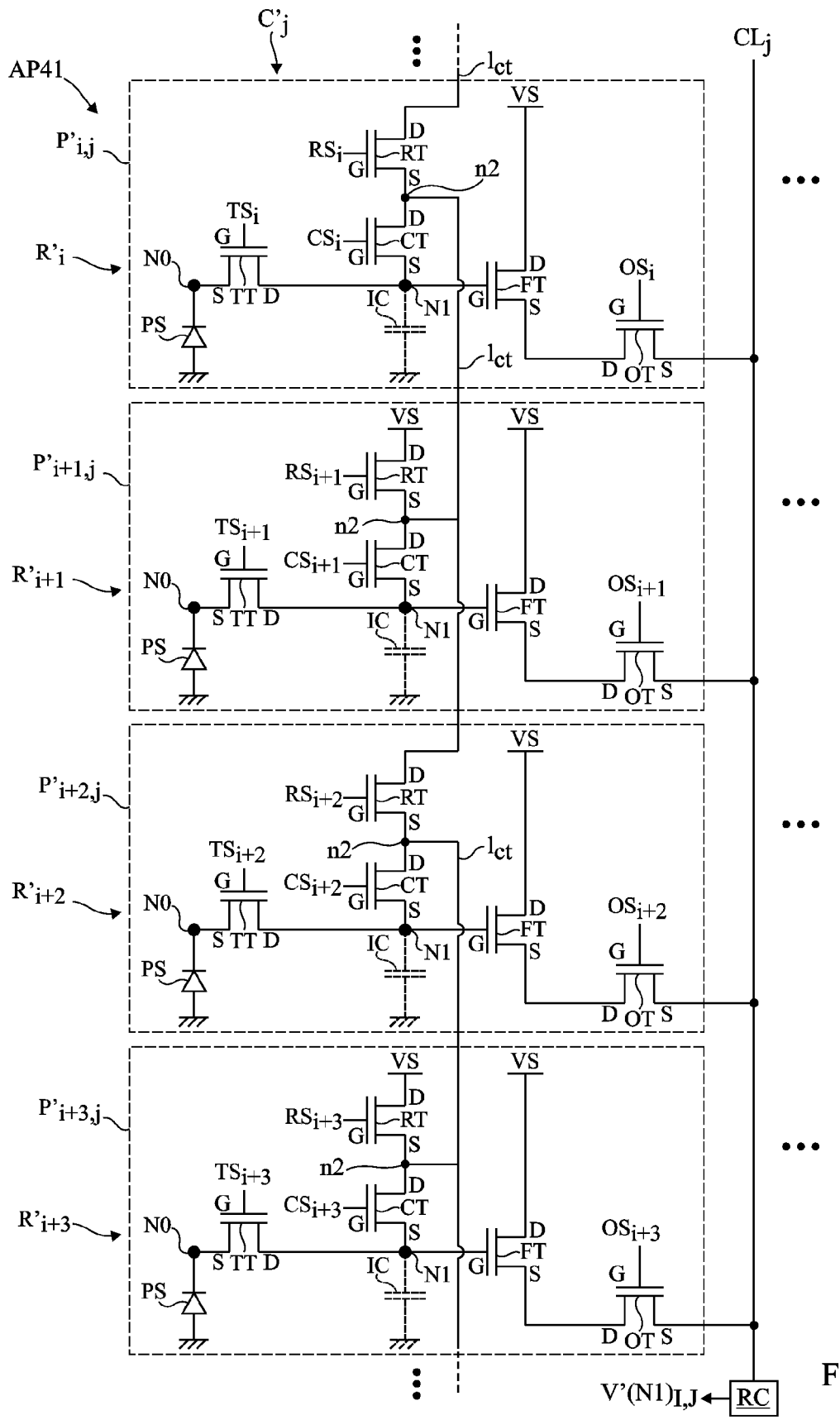
FIG. 4 is an electric diagram of a portion of another alternative embodiment of the image sensor of FIG. 2.

FIG. 1 is an electric diagram of a portion of an example of an image sensor of the type described in the above-mentioned prior patent applications, which corresponds to FIG. 4 of the above-referenced patent application. FIG. 1 shows a portion of an array AP11 of pixels of the image sensor, as well as a sensor read circuit, designated as RC in the drawing.

As shown in the drawing, array AP11 comprises pixels $P_{i,j}$ arranged along rows $R_i$ of rank i and columns $C_j$ of rank j. In the drawings, only four pixels $P_{i,j}$, $P_{i+2,j}$, and $P_{i+3,j}$, respectively belonging to rows $R_i$, $R_{i+1}$, $R_{i+2}$, and $R_{i+3}$ and to a same column $C_j$, as well as an output line $CL_j$ assigned to column $C_j$, have been shown. Each pixel comprises a photodetector PS, a photodiode in the shown example, a storage node N0 formed by the photodiode cathode, and a capacitive sense node N1. Node N1 is coupled to node N0 via a transfer transistor TT, to a node of voltage VS, for example, a high power supply voltage node, via a reset transistor RT, and to an output line $CL_j$ via a transistor FT connected as a source follower and an output transistor OT. Read circuit RC is connected to output lines $CL_j$, and provides voltages $V(N1)_{i,j}$ representative of the voltages of capacitive nodes N1 of the different pixels of columns $C_j$.

Capacitive node N1 has a capacitance shown in dotted lines in the drawing, in the form of a capacitor IC, which may be an intrinsic capacitance of node N1, for example, if node N1 comprises a floating diffused region (doped semiconductor region). Node N0, transistor TT, and node N1 altogether form means for converting charges into voltage, or a charge-to-voltage conversion circuit.

In the example of FIG. 1, each pixel further comprises a connection transistor CT which couples its capacitive node N1 to capacitive node N1 of a pixel of a row of lower rank located on the same column as the considered pixel. In the shown example, pixel $P_{i+3,j}$ has a connection transistor CT which couples its node N1 to node N1 of pixel $P_{i+2,j}$, pixel $P_{i+2,j}$ has a connection transistor CT which couples its node N1 to node N1 of pixel $P_{i+1,j}$, pixel $P_{i+1,j}$ has a connection transistor CT which couples its node N1 to node N1 of pixel $P_{i,j}$, and so on.

A control circuit 10, which may include a row decoder, supplies each pixel with control signals TS, RS, OS, and CS. In FIG. 1, the control signals applied to the different pixels are differentiated by their rank i, from $TS_i$, $RS_i$, $OS_i$, and $CS_i$ for pixel $P_{i,j}$ to $TS_{i+3}$, $RS_{i+3}$, $OS_{i+3}$, and $CS_{i+3}$ for pixel $P_{i+3,j}$. Signal TS is a transfer signal applied to a gate of transfer transistor TT, signal RS is a reset signal applied to a gate of reset transistor RT, signal OS is a read signal applied to a gate of output or read control transistor OT, and signal CS is a connection signal applied to a gate of connection transistor CT, to connect capacitive node N1 of the considered pixel to the capacitive node of the pixel of the same column and of lower rank i to which it is coupled.

Conventionally, on acquisition of an image, the pixels are initialized, integrated, and read row by row, according to overlapping control cycles. All the pixels of a selected row, or current row, are initialized, integrated, and read at the same time during a row acquisition cycle. The pixels of the next row (in the sensor row browsing order) are initialized, integrated, and read during a control cycle which partially overlaps the control cycle of the current row, with a predetermined time shift with respect to the control cycle of the current row. The reading of the pixels of a line is performed via read circuit RC, via the different column output lines $CL_j$ of the sensor.

When an image has been captured, a signal processing unit (not shown) analyzes the different voltages $V(N1)_{i,j}$ read from the capacitive nodes N1 of the different pixels $P_{i,j}$, and decides whether, during the next image capture, capacitive nodes N1 should be connected to one or several capacitive nodes of one or several pixels of lower rank i in the array, to increase their capacitance. As an example, if the different voltages $V(N1)_{i,j}$ are high and close to a saturation value, the processing unit may decide to connect the capacitive node of each pixel to the capacitive node of a pixel of immediately lower rank i (i−1) in the array, to increase its capacitance. If the different voltages $V(N1)_{i,j}$ remain high and close to the saturation value when the next image is captured, or after several image captures, the processing unit may decide to connect node N1 of each pixel to an additional capacitive node of a pixel of still lower rank (i−2) in the array.

It would be desirable to be able to improve the behavior of existing image sensors of adjustable reading capacity, and more specifically that of sensors with interconnectable sense nodes of the type described in relation with FIG. 1. In particular, it would be desirable to have an image sensor with interconnectable sense nodes behaving better than existing sensors in low luminosity conditions.

In low luminosity conditions, it is desired for the capacitance of sense node N1 of each pixel to be low, in order to have a high charge-to-voltage conversion coefficient. Now, the capacitance of sense node N1 of a pixel is all the larger has the number of transistors connected to this node N1 is high. Indeed, the gate and/or source/drain capacitances of the transistors connected to node N1, that is, transistors TT, RT, FT, and CT in the example of FIG. 1, add to the capacitance of node N1. Further, the longer the tracks connected to node N1, the higher the capacitance of node N1. In the example of FIG. 1, the conductive track connecting node N1 of a pixel $P_{i,j}$ to the drain of transistor CT of pixel $P_{i+1,j}$ also takes part in significantly increasing the capacitance of node N1 of pixel $P_{i,j}$.

In other words, in the example of FIG. 1, the presence of the connection elements coupling sense nodes N1 to one another increases the intrinsic capacitance of node N1 of each pixel, even when these connection elements are not activated to interconnect several nodes N1.

It would be desirable to have a pixel array where:
the sense node of each pixel can be connected to at least one sense node of another pixel in the array, to decrease the charge-to-voltage conversion coefficient of the pixel; and
the connection elements coupling the sense nodes to one another cause little or no increase (with respect to existing structures) of the intrinsic sense node capacitance of each pixel, when they are not activated to interconnect sense nodes.

Figure 2:
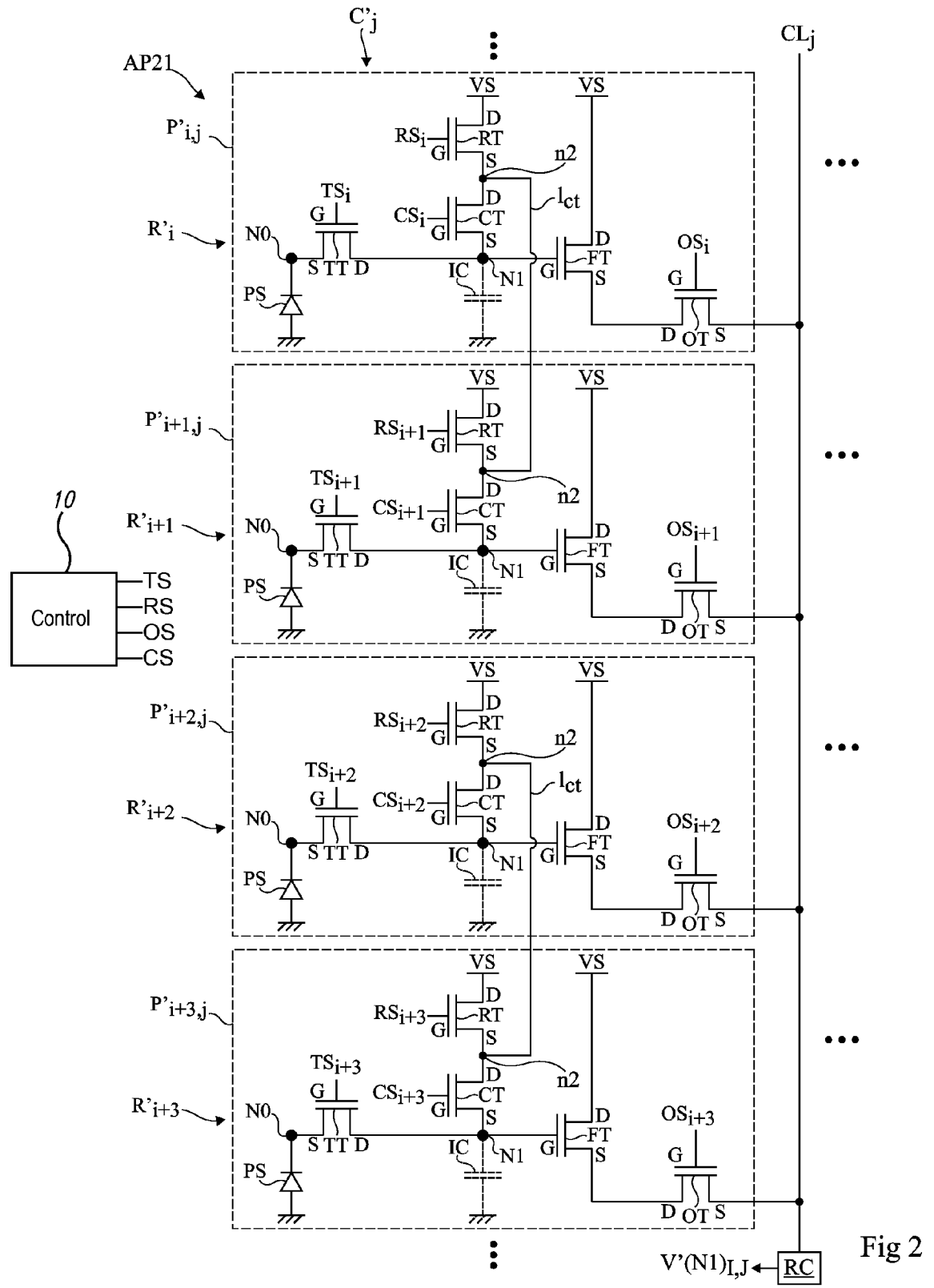
FIG. 2 is an electric diagram of a portion of an embodiment of an image sensor.

FIG. 2 is an electric diagram of a portion of an embodiment of an image sensor wherein the sense node of a pixel can be connected to at least one sense node of another pixel to decrease the charge-to-voltage conversion gain of the pixel. FIG. 2 shows a portion of an array AP21 of pixels of the sensor, as well as a read circuit RC of the sensor.

As shown in the drawing, array AP21 comprises pixels $P'_{i,j}$ arranged along rows $R'_i$ of rank i and columns $C'_j$ of rank j. In the drawing, only four pixels $P'_{i,j}$, $P'_{i+1,j}$, $P'_{i+2,j}$, and $P'_{i+3,j}$, respectively belonging to rows $R'_i$, $R'_{i+1}$, $R'_{i+2}$ and $R'_{i+3}$ and to a same column $C'_j$, and an output row $CL_j$ assigned to column $C'_j$, have been shown. Each pixel comprises a photodetector PS, a photodiode in the shown example, a storage node N0 formed by the cathode of the photodiode, and a capacitive sense node N1. Node N1 is coupled to node N0 via a transfer transistor TT, and to a node n2 via a connection transistor CT, node n2 being itself connected to a node of voltage VS via reset transistor RT. It should be noted that the described embodiments are not limited to the present example, where a same reference voltage VS is applied to the drains of transistors FT and RT. Node N1 is further coupled to output line $CL_j$ via a transistor FT connected as a source follower and an output or read control transistor OT. In this example, transistor FT has a gate connected to node N1, a drain receiving voltage VS, and a source connected to a drain of transistor OT, which itself has a source connected to output line $CL_j$. As an example, transistor TT has a source connected to the cathode of photodiode PS (node N0), and a drain connected to node N1, transistor CT has a source connected to node N1 and a drain connected to node n2, and transistor RT has a source connected to node n2 and a drain connected to voltage node VS. Read circuit RC is connected to output lines $CL_j$, and provides voltages $V(N1)_{I,J}$ representative of the voltages of capacitive nodes N1 of the different pixels of columns $C'_j$.

Capacitive node N1 has a capacitance shown in dotted lines in the drawing, in the form of a capacitor IC, which may be an intrinsic capacitance of node N1, for example, if node N1 comprises a floating diffused region (doped semiconductor region). Node N0, transistor TT, and node N1 altogether form means for converting charges into voltage, or a charge-to-voltage conversion circuit. Transistor TT may be a simple transfer gate between a first semiconductor region forming node N0 and a second semiconductor region forming node N1, rather than a complete transistor with its own source region and its own drain region.

According to an aspect of the described embodiments, node n2 of each pixel in the array, or junction point of transistors CT and RT of the pixel, is connected to at least another node n2 of another pixel of the sensor, by a conductive track $1_{ct}$. In the example of FIG. 2, node n2 of each pixel is connected to node n2 of a neighboring pixel, located on the same column and on a row of immediately lower or immediately higher rank. In the shown example, node n2 of pixel $P'_{i,j}$ is connected to node n2 of pixel $P'_{i+1,j}$ by a first conductive track $1_{ct}$, node n2 of pixel $P'_{i+2,j}$ is connected to node n2 of pixel $P'_{i+3,j}$ by a second conductive track $1_{ct}$ which is not connected to first track $1_{ct}$, and so on.

A row decoder, not shown, provides each pixel with control signals TS, RS, OS, and CS. In FIG. 1, the control signals applied to the different pixels are differentiated by their rank i, from $TS_i$, $RS_i$, $OS_i$ and $CS_i$ for pixel $P'_{i,j}$ to $TS_{i+3}$, $RS_{i+3}$, $OS_{i+3}$ and $CS_{i+3}$ for pixel $P'_{i+3,j}$. Signal TS is a transfer signal applied to a gate of transfer transistor TT, signal RS is a reset signal applied to a gate of reset transistor RT, signal OS is a read signal applied to a gate of output transistor OT, and signal CS is a connection signal applied to a gate of connection transistor CT.

On acquisition of an image, the pixels are initialized, integrated, and read row by row, according to overlapping control cycles. All the pixels of a selected row, or current row, may be initialized, integrated, and read at the same time during a row acquisition cycle. The pixels of the next row (in the sensor row browsing order), may be initialized, integrated, and read during a row acquisition cycle which partially overlaps the current row acquisition cycle, with a predetermined time shift with respect to the control cycle of the current row. As an example, the sensor rows are read by increasing rank i. The reading of the pixels of a row is performed via read circuit RC, via the different column output lines $CL_j$ of the sensor, all the pixels of a same column $C'_j$ being connected to a same output line $CL_j$ and the pixels of different columns being connected to different output lines $CL_j$ in this example.

When an image has been captured, a signal processing unit (not shown) analyzes the different voltages $V'(N1)_{I,J}$ read from capacitive nodes N1 of the different pixels $P'_{I,J}$, and decides whether, at the next capture, the capacitances of sense nodes N1 should be increased. Other decision criteria may however be used. For example, the decision may be taken according to the settings of the device and apply to the entire array and for all the image captures performed by the array. As a variation, in certain applications, it may be provided to capture images by alternating low conversion gain captures and higher conversion gain captures.

To increase the capacitance of the sense node of a pixel (for example, pixel $P'_{i,j}$) during the phase of conversion into voltage of the charges photogenerated in this pixel, it may be provided to connect node N1 of this pixel to node N1 of the neighboring pixel to which it is coupled (in the example, pixel $P'_{i+1,j}$). To achieve this, connection transistor CT of the pixel being currently read (pixel $P'_{i,j}$), as well as connection transistor CT of the neighboring pixel to which it is coupled (pixel $P'_{i+1,j}$), may be made conductive.

As a result, the capacitance of node N1 of the pixel being currently read (pixel $P'_{i,j}$) is increased by the capacitance of node N1 of the neighboring pixel (pixel $P'_{i+1,j}$) as well as by the capacitance of connection line $1_{ct}$ connecting the two pixels.

To increase, by a lesser extent, the capacitance of sense node N1 of the pixel being currently read (pixel $P'_{i,j}$), it may also be provided to turn on connection transistor CT of this pixel, while maintaining in the off state connection transistor CT of the neighboring pixel with which it is coupled (pixel $P'_{i+1,j}$). As a result, the capacitance of node N1 of the pixel being currently read (pixel $P'_{i,j}$) is increased by the sole capacitance of connection line $1_{ct}$ connecting the two pixels.

The decision of increasing or not the capacitance of sense node N1 of the pixels is communicated to the control circuit 10 and is executed by this circuit during the next read cycle.

As an example, if the different voltages $V'(N1)_{I,J}$ are high and close to a saturation value, the processing unit may decide to increase the capacitance of the sense node of each pixel by the sole capacitance of the line $1_{ct}$ connecting the pixel to a neighboring pixel. If voltages $V'(N1)_{I,J}$ remain high and close to the saturation value when the next image is captured, or after several image captures, the processing unit may decide to increase the capacitance of the sense node of each pixel by the capacitance of line $1_{ct}$ and by the capacitance of sense node N1 of the neighboring pixel to which it is coupled.

Voltages $V'(N1)_{I,J}$ may for example be compared with thresholds, and the external processing unit may decide to connect node N1 of a pixel to the sole conductive track $1_{ct}$ if voltages $V'(N1)_{I,J}$ are greater than a first threshold, or to track $1_{ct}$ and to sense node N1 of the neighboring pixel to which it is connected if voltages $V'(N1)_{I,J}$ are greater than a second threshold greater than the first threshold.

When it is chosen to increase the capacitance of sense node N1 of a given sensor pixel, for example, in case of a strong luminosity, it may be provided to maintain connection transistor CT of this pixel in the on state during the entire pixel read cycle, or at least during the possible phases of reset of nodes N1 and N0, the possible resets of nodes N1 and N0 being then performed via reset transistor RT.

When it is chosen not to increase the capacitance of sense node N1 of a given sensor pixel, for example, in case of a low luminosity, it may be provided to maintain reset transistor RT in the on state during the entire pixel read cycle, or at least during the possible phases of resetting of nodes N0 and N1, to transfer reset voltage VS to node n2 of the pixel. The possible reset(s) of nodes N0 and N1 of the pixel may then be performed via connection transistor CT of the pixel.

An advantage of the embodiment described in relation with FIG. 2 is that in each pixel of the array, when connection transistor CT of the pixel is in the off state, for example, when the luminosity is low, sense node N1 of the pixel only "sees", that is, is only directly connected to, three transistors (transistors TT, CT, and FT), to be compared with five (transistors TT, RT, CT, and FT of the pixel and transistor CT of a neighboring pixel) in the example of FIG. 1. Further, in the embodiment of FIG. 2, when connection transistor CT of the pixel is off, sense node N1 of the pixel does not "see" the conductive track ($1_{ct}$) which couples node N1 of the pixel to node N1 of a neighboring pixel, conversely to the example of FIG. 1. Thus, in the embodiment of FIG. 2, the connection elements connecting sense nodes N1 of different pixels two by two cause no or little (as compared with existing architectures) increase of the intrinsic capacitance of sense node N1 of each pixel, when these connection elements are not activated to interconnect sense nodes of different pixels. The embodiment of FIG. 2 especially enables to obtain a higher conversion gain, and thus a better sensitivity, especially in case of a low luminosity, than existing sensors with interconnectable sense nodes.

Another advantage of the embodiment of FIG. 2 is that it is compatible with usual pixel reading methods (provided to perform the possible above-mentioned adaptations during reset phases), for example, methods of the type described in the above-mentioned prior patent applications of the applicant, and in particular methods of the type described in relation with FIG. 6 of the above-mentioned prior patent application, where, when sense nodes N1 of different pixels are interconnected (for example, in case of a high luminosity), the voltage of interconnected nodes N1 is read via several different output transistors OT, connected in parallel to a same output line $CL_j$. This allows a faster reading of the sense node voltages, and further enables to decrease the reading noise.

Another advantage of the embodiment of FIG. 2 is that it is compatible with the implementation of methods of image acquisition by averaging or gathering of pixels, currently called "binning" in the art, where photogenerated charges stored in photodiodes of different pixels are simultaneously transferred to a same sense node to be converted into voltage.

Figure 3:
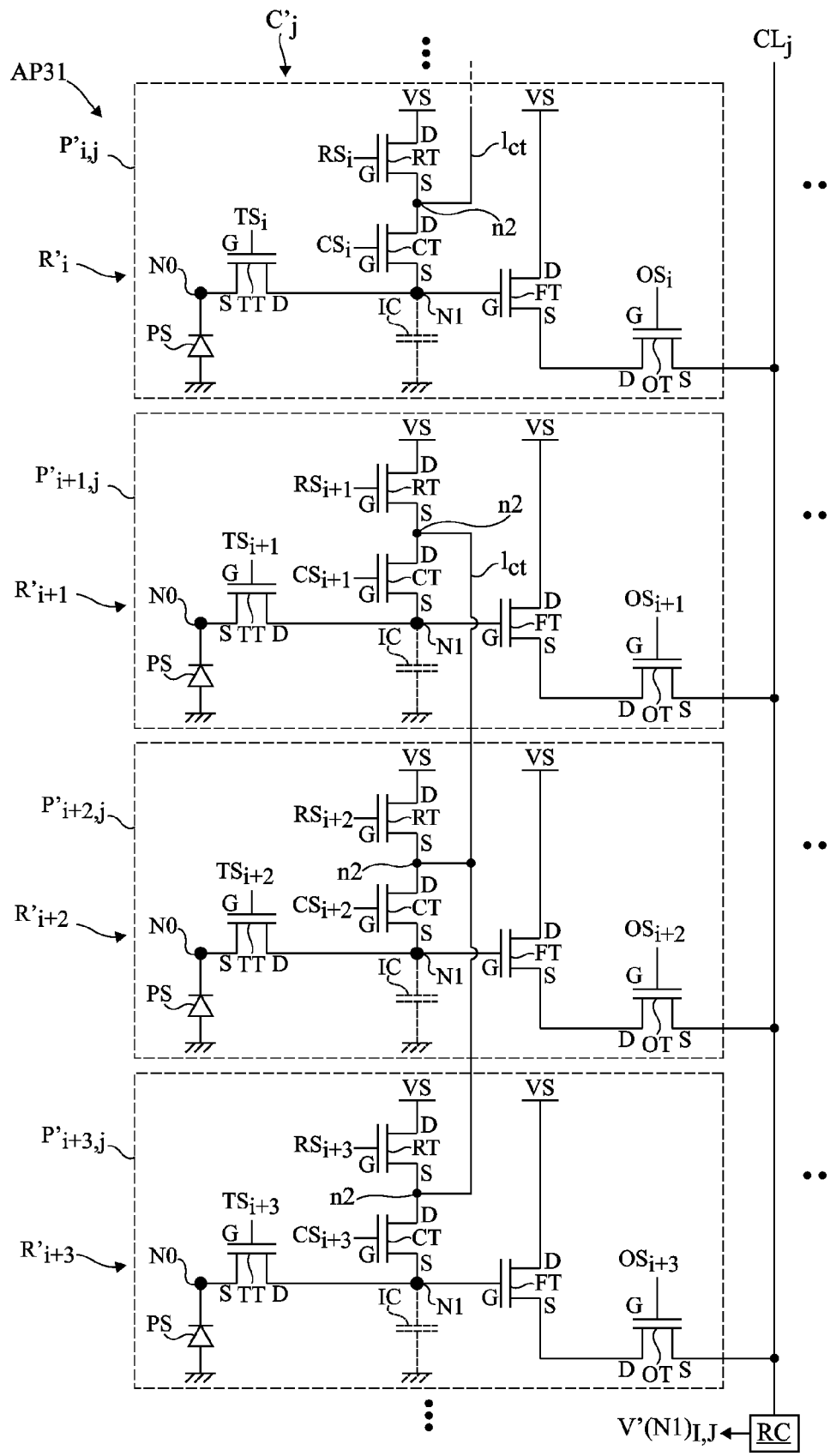
FIG. 3 is an electric diagram of a portion of an alternative embodiment of the image sensor of FIG. 2.

FIG. 3 is an electric diagram of a portion of an alternative embodiment of the image sensor of FIG. 2. FIG. 3 shows a portion of an array AP31 of pixels of the image sensor as well as a sensor read circuit RC.

As shown in the drawing, array AP31 comprises pixels $P'_{i,j}$ arranged along rows $R'_i$ of rank i and columns $C'_j$ of rank j. In the drawing, only four pixels $P'_{i,j}$, $P'_{i+1,j}$, $P'_{i+2,j}$, and $P'_{i+3,j}$, respectively belonging to rows $R'_i$, $R'_{i+1}$, $R'_{i+2}$ and $R'_{i+3}$ and to a same column $C'_j$, have been shown, as well as an output line $CL_j$ assigned to column $C'_j$. In this example, the pixels of array AP31 are similar or identical to the pixels of array AP21 of FIG. 2.

Pixel array AP31 of FIG. 3 differs from pixel array AP21 of FIG. 2 essentially by the connection paths between pixels. In array AP21 of FIG. 2, pixels are connected two by two via their nodes n2, in pairs of neighboring pixels. In array AP31 of FIG. 3, the pixels are connected three by three. More specifically, in array AP31 of FIG. 3, the pixels are connected by groups of three consecutive pixels of a same column $C'_j$, via conductive tracks $1_{ct}$ interconnecting nodes n2 of the pixels of each group. In the shown example, node n2 of pixel $P'_{i,j}$ is connected to node n2 of pixels $P'_{i-1,j}$ and $P'_{i-2,j}$ (not shown) by a first conductive track $1_{ct}$, node n2 of pixel $P'_{i+3,j}$ is connected to nodes n2 of pixels $P'_{i+2,j}$ and $P'_{i+1,j}$ by a second conductive track $1_{ct}$ which is not connected to first track $1_{ct}$, and so on.

In array AP31 of FIG. 3, to increase the capacitance of the sense node of a pixel (for example, pixel $P'_{i+2,j}$) during the phase of conversion into voltage of the charges photogenerated in this pixel, it may be provided to connect node N1 of this pixel to nodes N1 of the two pixels to which it is coupled by a same conductive track $1_{ct}$ (in the example, pixels $P'_{i+1,j}$ and $P'_{i+3,j}$). To achieve this, connection transistor CT of the pixel being currently read (pixel $P'_{i+2,j}$), as well as connection transistor CT of the pixels to which it is coupled (pixels $P'_{i+1,j}$ and $P'_{i+3,j}$) may be made conductive. As a result, the capacitance of node N1 of the pixel being currently read (pixel $P'_{i+2,j}$) is increased by the capacitance of nodes N1 of the pixels to which it is coupled (pixels $P'_{i+1,j}$ and $P'_{i+3,j}$) as well as by the capacitance of connection line $1_{ct}$ connecting the three pixels.

To increase, but by a lesser extent, the capacitance of sense node N1 of the pixel being currently read (pixel $P'_{i+2,j}$), it may also be provided to turn on connection transistor CT of this pixel, as well as transistor CT of a single one of the two pixels to which it is coupled (pixel $P'_{i+1,j}$ or pixel $P'_{i+3,j}$), and to maintain transistor CT of the other pixel in the off state. As a result, the capacitance of node N1 of the pixel being currently read (pixel $P'_{i+2,j}$) is increased by the capacitance of node N1 of a single one of the pixels to which it is coupled (pixel $P'_{i+1,j}$ or pixel $P'_{i+3,j}$) as well as by the capacitance of connection line $1_{ct}$.

To increase, but by a still lesser extent, the capacitance of sense node N1 of the pixel being currently read (pixel $P'_{i+2,j}$), it may be provided to turn on connection transistor CT of this pixel, while however maintaining in the off state connection transistor CT of the pixels to which it is coupled (pixels $P'_{i+1,j}$ and $P'_{i+3,j}$). As a result, the capacitance of node N1 of the pixel being currently read (pixel $P'_{i+2,j}$) is increased by the sole capacitance of conductive track $1_{ct}$.

The alternative embodiment of FIG. 3 has all the above-mentioned advantages of the embodiment of FIG. 2. Another advantage of the variation of FIG. 3 is that, in array AP31 of FIG. 3, the number of different values that the capacitance of sense node N1 of pixel may take is greater than in array AP21 of FIG. 2.

More specifically, according to the envisaged use, it will be within the abilities of those skilled in the art to provide groups of pixels interconnected via their nodes n2 by a same conductive track $1_{ct}$, the tracks of different groups being unconnected to one another, these groups having a number of pixels greater than three and/or being likely to have a pixel distribution in the array different from that of the examples of FIGS. 2 and 3.

It should further be noted that in each group of pixels interconnected by their nodes n2, a single reset transistor RT coupling track $1_{ct}$ of the group to voltage node VS would be sufficient (instead of one transistor RT per pixel in the examples of FIGS. 2 and 3). It may for example be provided that in each group of pixels, one of the pixels has a reset transistor RT between its node n2 and voltage node VS, as described hereinabove, and that transistor RT is suppressed in the other pixels in the group. In this case, reset voltage VS may be applied to nodes n2, N1, and/or N0 of each of the pixels in the group via track $1_{ct}$ of the group and connection transistor CT of the pixel. As a variation, it is possible to only provide a reset transistor RT in a single pixel in the group, and to replace transistors RT of the other pixels in the group by capacitive elements, for example, capacitors.

FIG. 4 is an electric diagram of a portion of another alternative embodiment of the image sensor of FIG. 2. FIG. 4 shows a portion of an array AP41 of pixels of the image sensor as well as a sensor read circuit RC.

As shown in the drawing, array AP41 comprises pixels $P'_{i,j}$ arranged along rows $R'_i$ of rank i and columns $C'_j$ of rank j. In the drawing, only four pixels $P'_{i+2,j}$, and $P'_{i+3,j}$, respectively belonging to rows $R'_i$, $R'_{i+1}$, $R'_{i+2}$ and $R'_{i+3}$ and to a same column $C'_j$, have been shown, as well as an output line $CL_j$ assigned to column $C'_j$. In this example, the pixels of array AP41 are similar or identical to the pixels of array AP21 of FIG. 2.

Pixel array AP41 of FIG. 4 differs from pixel array AP21 of FIG. 2 essentially by the connection paths between the array pixels. In array AP21 of FIG. 2, pixels are connected two by two via their nodes n2, in pairs of neighboring pixels, the pixels of neighboring pairs being unconnected to one another (except, possibly, by the column output line, or by other control, read, or power supply lines, not shown). In array AP41 of FIG. 4, the pixels are connected in pairs as in the example of FIG. 2, but different pairs of pixels are further interconnected. In the shown example, node n2 of pixel P'$_{i,j}$ is connected to node n2 of pixel P'$_{i+1,j}$ by a first conductive track $1_{ct}$, node n2 of pixel P'$_{i+2,j}$ is connected to node n2 of pixel P'$_{i+3,j}$ by a second conductive track $1_{ct}$ which is not connected to first track $1_{ct}$, and so on. Further, in this example, first conductive track $1_{ct}$ is connected to a drain of reset transistor RT of pixel P'$_{i+2,j}$, second conductive track $1_{ct}$ is connected to a drain of reset transistor RT of pixel P'$_{i+4,j}$ (not shown), and so on.

More generally, in the alternative embodiment of FIG. 4, the array pixels are distributed in groups of pixels having their nodes n2 connected by a same conductive track $1_{ct}$, and in each group of pixels, there exists at least one pixel comprising a transistor RT which couples node n2 of the pixel to a voltage node VS, and at least one pixel comprising a transistor RT which couples node n2 of the pixel to line $1_{ct}$ of another group of pixels in the array. It should be noted that this alternative embodiment is compatible with the alternative embodiment of FIG. 3, or with any other configuration of the interconnected groups of pixels.

The alternative embodiment of FIG. 4 has all the above-mentioned advantages of the embodiment of FIG. 2, and further has the advantage of providing, for each pixel, a wider choice of possible different conversion gains than in the example of FIG. 2. Further, the alternative embodiment of FIG. 4 provides extended possibilities of image acquisition by binning as compared with the embodiments of FIGS. 2 and 3.

Specific embodiments have been described. Various alterations, modifications, and improvements will readily occur to those skilled in the art.

In particular, the embodiments described hereinabove are compatible with image acquisition methods where, during a same image capture, different charge-to-voltage conversion gains are assigned to different pixels of the sensor, for example, in the case of a scene comprising both very bright regions and very dark regions. Further, in certain video applications, it may be provided to interlace frames acquired with different conversion gains.

Further, the above-described embodiments are compatible with other pixel architectures than those mentioned hereinabove, for example, with a pixel architecture conventionally designated as 2T5, where two photodiodes are coupled to a same capacitive sense node by two transfer transistors, with a 1T75-type architecture (four charge transfer gates and three other transistors for four photodiodes), a 2T-type architecture, etc.

It should further be noted that the conduction nodes, that is, the drain and source nodes of the different transistors, may be inverted with respect to what has been described hereinabove, according to whether the transistors are P-channel transistors or N-channel transistors.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An image sensor comprising:
    an array of pixels, each pixel having:
        a storage node;
        a capacitive sense node
        a transfer transistor coupling the storage node to the capacitive sense node;
        an intermediate node;
        a reset voltage node configured to receive a reset voltage; and
        a connection transistor coupling the sense node to the intermediate node of the pixel;
    a first conductive connection track coupling the intermediate nodes of first and second pixels of the array to each other; and
    a control circuit configured to cause the connection transistor of the first pixel to electrically couple the capacitive sense node of the first pixel to the intermediate node of the second pixel via the first conductive connection track during a voltage conversion phase in which the transfer transistor of the first pixel converts photogenerated charges from the storage node of the first pixel to a voltage on the capacitive sense node of the first pixel.

2. The sensor of claim 1, wherein each pixel further comprises a source follower transistor connected as a source follower, having a gate coupled to the sense node of the pixel.

3. The sensor of claim 2, wherein each pixel further comprises an output transistor coupling a source of the source follower transistor of the pixel to an output line.

4. The sensor of claim 1, wherein the pixels of the array are distributed into at least first and second groups of pixels, the first and second pixels being part of the first group of pixels, the sensor comprising:
    a second conductive connection track coupling the respective intermediate nodes of the pixels of the second group to each other, the first and second conductive connection tracks being unconnected to one another.

5. The sensor of claim 4, wherein the pixels of the first group are located on a same column of the array.

6. The sensor of claim 4, wherein the pixels of the first group are juxtaposed two by two in the array.

7. The sensor of claim 4, further comprising a track connection transistor coupling the first and second connection tracks to each other.

8. The sensor of claim 1, wherein each pixel comprises a photodiode having a cathode connected to the storage node of the pixel.

9. The sensor of claim 1, wherein each pixel comprises a reset transistor coupled between a reset voltage terminal and the intermediate node of the pixel.

10. The sensor of claim 9, wherein the reset transistor of the second pixel is coupled with the first conductive connection track between the intermediate nodes of the first and second pixels.

11. A method, comprising:
   capturing an image using the sensor of claim 1, the capturing including reading the first pixel of the sensor during a reading cycle of the first pixel, and
   electrically coupling the capacitive sense node of the first pixel to the capacitive sense node of the second pixel during the reading cycle of the first pixel.

12. The method of claim 11, wherein each pixel further comprises a source follower transistor connected as a source follower, having a gate coupled to the sense node of the pixel, the source follower transistor of the first pixel outputting a voltage corresponding to the photogenerated charges from the storage node of the first pixel.

13. The method of claim 12, wherein each pixel further comprises an output transistor that outputs to an output line and output voltage corresponding to the voltage output by the source follower transistor.

14. An image sensor comprising:
   an array of pixels, each pixel having:
      a storage node;
      a capacitive sense node
      a transfer transistor coupling the storage node to the capacitive sense node;
      an intermediate node;
      a reset voltage node configured to receive a reset voltage; and
      a connection transistor coupling the sense node to the intermediate node of the pixel; and
   means for electrically coupling the capacitive sense node of the first pixel to the intermediate node of the second pixel during a voltage conversion phase in which the transfer transistor of the first pixel converts photogenerated charges from the storage node of the first pixel to a voltage on the capacitive sense node of the first pixel.

15. The sensor of claim 14, wherein each pixel further comprises:
   a source follower transistor connected as a source follower, having a gate coupled to the sense node of the pixel; and
   an output transistor coupling a source of the source follower transistor of the pixel to an output line.

16. The sensor of claim 14, wherein the pixels of the array are distributed into at least first and second groups of pixels, the first and second pixels being part of the first group of pixels, the sensor comprising:
   means for coupling the respective intermediate nodes of the pixels of the second group to each other.

17. The sensor of claim 14, wherein each pixel comprises a photodiode having a cathode connected to the storage node of the pixel.

18. The sensor of claim 14, wherein each pixel comprises a reset transistor coupled between a reset voltage terminal and the intermediate node of the pixel.

19. The sensor of claim 18, wherein the reset transistor of the second pixel is part of the means for electrically coupling the capacitive sense node of the first pixel to the intermediate node of the second pixel.

* * * * *